(12) United States Patent
Lindemann et al.

(10) Patent No.: US 12,176,781 B2
(45) Date of Patent: Dec. 24, 2024

(54) METHODS AND SYSTEMS FOR ESTIMATING TRANSDUCER PARAMETERS

(71) Applicant: Cirrus Logic International Semiconductor Ltd., Edinburgh (GB)

(72) Inventors: Eric Lindemann, Boulder, CO (US); John L. Melanson, Austin, TX (US); Emmanuel Marchais, Dripping Springs, TX (US); Carl Lennart Ståhl, Malmö (SE)

(73) Assignee: Cirrus Logic Inc., Austin, TX (US)

( * ) Notice: Subject to any disclaimer, the term of this patent is extended or adjusted under 35 U.S.C. 154(b) by 830 days.

(21) Appl. No.: 16/816,833

(22) Filed: Mar. 12, 2020

(65) Prior Publication Data

US 2020/0313529 A1     Oct. 1, 2020

Related U.S. Application Data

(60) Provisional application No. 62/826,348, filed on Mar. 29, 2019, provisional application No. 62/826,388, filed on Mar. 29, 2019.

(51) Int. Cl.

| | |
|---|---|
| *H02K 11/23* | (2016.01) |
| *B06B 1/02* | (2006.01) |
| *B06B 1/04* | (2006.01) |
| *G06F 1/02* | (2006.01) |
| *G06F 3/01* | (2006.01) |

(Continued)

(52) U.S. Cl.
CPC ........... *H02K 33/00* (2013.01); *B06B 1/0215* (2013.01); *B06B 1/0261* (2013.01); *B06B 1/045* (2013.01); *G06F 1/022* (2013.01); *G06F 3/016* (2013.01); *G08B 6/00* (2013.01); *H03F 1/0211* (2013.01)

(58) Field of Classification Search
CPC ....... H02K 33/00; B06B 1/0261; G06F 3/016; H03F 1/0211
See application file for complete search history.

(56) References Cited

U.S. PATENT DOCUMENTS

| | | |
|---|---|---|
| 3,686,927 A | 8/1972 | Scharton |
| 4,902,136 A | 2/1990 | Mueller et al. |

(Continued)

FOREIGN PATENT DOCUMENTS

| | | |
|---|---|---|
| AU | 2002347829 | 4/2003 |
| CN | 103165328 A | 6/2013 |

(Continued)

OTHER PUBLICATIONS

International Search Report and Written Opinion of the International Searching Authority, International Application No. PCT/US2020/024864, mailed Jul. 6, 2020.

(Continued)

*Primary Examiner* — Muhammad S Islam
(74) *Attorney, Agent, or Firm* — Jackson Walker L.L.P.

(57) ABSTRACT

A system for estimating parameters of an electromagnetic load may include an input for receiving an input excitation signal to the electromagnetic load, a broadband content estimator that identifies at least one portion of the input excitation signal having broadband content, and a parameter estimator that uses the at least one portion of the input excitation signal to estimate and output one or more parameters of the electromagnetic load.

20 Claims, 5 Drawing Sheets

(51) Int. Cl.
  *G08B 6/00* (2006.01)
  *H02K 33/00* (2006.01)
  *H03F 1/02* (2006.01)

(56) References Cited

U.S. PATENT DOCUMENTS

| | | |
|---|---|---|
| 5,374,896 A | 12/1994 | Sato et al. |
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,294,891 B1 | 9/2001 | McConnell et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,816,833 B1 * | 11/2004 | Iwamoto ............ G10H 1/366 84/622 |
| 6,906,697 B2 | 6/2005 | Rosenberg |
| 6,995,747 B2 | 2/2006 | Casebolt et al. |
| 7,042,286 B2 | 5/2006 | Meade et al. |
| 7,154,470 B2 | 12/2006 | Tierling |
| 7,277,678 B2 | 10/2007 | Rozenblit et al. |
| 7,301,094 B1 * | 11/2007 | Noro ............... B06B 1/0215 84/645 |
| 7,333,604 B2 | 2/2008 | Zernovizky et al. |
| 7,392,066 B2 | 6/2008 | Hapamas |
| 7,456,688 B2 | 11/2008 | Okazaki et al. |
| 7,623,114 B2 | 11/2009 | Rank |
| 7,639,232 B2 | 12/2009 | Grant et al. |
| 7,777,566 B1 | 8/2010 | Drogi et al. |
| 7,791,588 B2 | 9/2010 | Tierling et al. |
| 7,825,838 B1 | 11/2010 | Srinivas et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Wang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,659 B2 | 2/2014 | Oh et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,754,758 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,019,087 B2 | 4/2015 | Bakircioglu et al. |
| 9,030,428 B2 | 5/2015 | Fleming |
| 9,063,570 B2 | 6/2015 | Weddle et al. |
| 9,070,856 B1 | 6/2015 | Rose et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 * | 5/2016 | Buuck ............... G06F 3/04184 |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair et al. |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 9,990,089 B2 | 6/2018 | Dickinson et al. |
| 10,032,550 B1 | 7/2018 | Zhang et al. |
| 10,039,080 B2 | 7/2018 | Miller et al. |
| 10,055,950 B2 | 8/2018 | Saboune et al. |
| 10,074,246 B2 | 9/2018 | Da Costa et al. |
| 10,082,873 B2 | 9/2018 | Zhang |
| 10,102,722 B2 | 10/2018 | Levesque et al. |
| 10,110,152 B1 | 10/2018 | Hajati |
| 10,165,358 B2 | 12/2018 | Koudar et al. |
| 10,171,008 B2 | 1/2019 | Nishitani et al. |
| 10,175,763 B2 | 1/2019 | Shah |
| 10,191,579 B2 * | 1/2019 | Forlines ............ G06F 3/044 |
| 10,264,348 B1 | 4/2019 | Harris et al. |
| 10,402,031 B2 | 9/2019 | Vandermeijden et al. |
| 10,447,217 B2 | 10/2019 | Zhao et al. |
| 10,452,144 B2 | 10/2019 | Aimone et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,638 B2 | 7/2020 | Mondello et al. |
| 10,732,714 B2 | 8/2020 | Rao et al. |
| 10,735,956 B2 | 8/2020 | Bae et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,841,696 B2 | 11/2020 | Mamou-Mani |
| 10,848,886 B2 | 11/2020 | Rand |
| 10,860,202 B2 | 12/2020 | Sepehr et al. |
| 10,969,871 B2 | 4/2021 | Rand et al. |
| 10,976,825 B2 | 4/2021 | Das et al. |
| 11,069,206 B2 | 7/2021 | Rao et al. |
| 11,079,874 B2 | 8/2021 | Lapointe et al. |
| 11,139,767 B2 | 10/2021 | Janko et al. |
| 11,150,733 B2 | 10/2021 | Das et al. |
| 11,259,121 B2 | 2/2022 | Lindemann et al. |
| 11,460,526 B1 | 10/2022 | Foo et al. |
| 11,500,469 B2 | 11/2022 | Rao et al. |
| 2001/0043714 A1 | 11/2001 | Asada et al. |
| 2002/0018578 A1 | 2/2002 | Burton |
| 2002/0044046 A1 * | 4/2002 | Takahashi ............ G08B 3/10 340/407.1 |
| 2002/0085647 A1 | 7/2002 | Oishi et al. |
| 2003/0068053 A1 | 4/2003 | Chu |
| 2003/0214485 A1 | 11/2003 | Roberts |
| 2004/0120540 A1 | 6/2004 | Mullenborn et al. |
| 2005/0031140 A1 | 2/2005 | Browning |
| 2005/0134562 A1 | 6/2005 | Grant et al. |
| 2005/0195919 A1 * | 9/2005 | Cova ............... H03F 1/3294 375/297 |
| 2006/0028095 A1 | 2/2006 | Maruyama et al. |
| 2006/0197753 A1 | 9/2006 | Hotelling |
| 2006/0284856 A1 | 12/2006 | Soss |
| 2007/0013337 A1 | 1/2007 | Liu et al. |
| 2007/0024254 A1 | 2/2007 | Radecker et al. |
| 2007/0241816 A1 | 10/2007 | Okazaki et al. |
| 2008/0077367 A1 | 3/2008 | Odajima |
| 2008/0226109 A1 | 9/2008 | Yamakata et al. |
| 2008/0240458 A1 | 10/2008 | Goldstein et al. |

(56) References Cited

U.S. PATENT DOCUMENTS

| | | |
|---|---|---|
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1* | 7/2009 | Krah .................. G06F 3/0446 |
| | | 345/173 |
| 2009/0278819 A1 | 11/2009 | Goldenberg et al. |
| 2009/0279719 A1 | 11/2009 | Lesso |
| 2009/0313542 A1 | 12/2009 | Cruz-Hernandez et al. |
| 2010/0013761 A1 | 1/2010 | Birnbaum et al. |
| 2010/0080331 A1 | 4/2010 | Garudadri et al. |
| 2010/0085317 A1 | 4/2010 | Park et al. |
| 2010/0141408 A1 | 6/2010 | Doy et al. |
| 2010/0260371 A1 | 10/2010 | Afshar |
| 2010/0261526 A1 | 10/2010 | Anderson et al. |
| 2010/0331685 A1 | 12/2010 | Stein et al. |
| 2011/0056763 A1 | 3/2011 | Tanase et al. |
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0105367 A1 | 5/2012 | Son et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0208923 A1* | 8/2013 | Suvanto ................ H04R 3/005 |
| | | 381/122 |
| 2013/0275058 A1 | 10/2013 | Awad |
| 2013/0289994 A1 | 10/2013 | Newman et al. |
| 2013/0307786 A1 | 11/2013 | Heubel |
| 2014/0035736 A1 | 2/2014 | Weddle et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0125467 A1 | 5/2014 | Da Costa et al. |
| 2014/0139327 A1 | 5/2014 | Bau et al. |
| 2014/0176415 A1 | 6/2014 | Buuck et al. |
| 2014/0205260 A1 | 7/2014 | Lacroix et al. |
| 2014/0222377 A1 | 8/2014 | Bitan et al. |
| 2014/0226068 A1 | 8/2014 | Lacroix et al. |
| 2014/0253303 A1 | 9/2014 | Levesque |
| 2014/0292501 A1 | 10/2014 | Lim et al. |
| 2014/0300454 A1 | 10/2014 | Lacroix et al. |
| 2014/0340209 A1 | 11/2014 | Lacroix et al. |
| 2014/0347176 A1 | 11/2014 | Modarres et al. |
| 2015/0010176 A1* | 1/2015 | Schevciw ................ F21S 8/02 |
| | | 381/190 |
| 2015/0201294 A1 | 1/2015 | Risberg et al. |
| 2015/0049882 A1 | 2/2015 | Chiu et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0077324 A1 | 3/2015 | Birnbaum et al. |
| 2015/0084752 A1 | 3/2015 | Heubel et al. |
| 2015/0116205 A1 | 4/2015 | Westerman et al. |
| 2015/0130767 A1 | 5/2015 | Myers et al. |
| 2015/0154966 A1* | 6/2015 | Bharitkar .............. G10L 19/008 |
| | | 381/23 |
| 2015/0204925 A1 | 7/2015 | Hernandez et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0249888 A1* | 9/2015 | Bogdanov ........... H03F 3/45475 |
| | | 381/98 |
| 2015/0264455 A1* | 9/2015 | Granato ................... H04R 3/06 |
| | | 381/162 |
| 2015/0268768 A1 | 9/2015 | Woodhull et al. |
| 2015/0324116 A1 | 11/2015 | Marsden et al. |
| 2015/0325116 A1 | 11/2015 | Umminger, III |
| 2015/0339898 A1 | 11/2015 | Saboune et al. |
| 2015/0341714 A1 | 11/2015 | Ahn et al. |
| 2015/0355259 A1* | 12/2015 | Sartler .................. H02M 1/126 |
| | | 324/548 |
| 2015/0356981 A1 | 12/2015 | Johnson et al. |
| 2015/0359452 A1 | 12/2015 | Giovangrandi et al. |
| 2016/0004311 A1 | 1/2016 | Yliaho |
| 2016/0007095 A1 | 1/2016 | Lacrois |
| 2016/0063826 A1 | 3/2016 | Morrell et al. |
| 2016/0070353 A1 | 3/2016 | Lacroix et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0103489 A1 | 4/2016 | Cruz-Hernandez et al. |
| 2016/0132118 A1 | 5/2016 | Park et al. |
| 2016/0141606 A1 | 5/2016 | Ahn et al. |
| 2016/0155305 A1 | 6/2016 | Barsilai et al. |
| 2016/0162031 A1 | 6/2016 | Westerman et al. |
| 2016/0179203 A1 | 6/2016 | Modarres et al. |
| 2016/0187987 A1 | 6/2016 | Ulrich et al. |
| 2016/0195930 A1 | 7/2016 | Venkatesan et al. |
| 2016/0227614 A1 | 8/2016 | Lissoni et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0305996 A1 | 10/2016 | Martens et al. |
| 2016/0328065 A1 | 11/2016 | Johnson et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0097381 A1 | 4/2017 | Stephens et al. |
| 2017/0131131 A1 | 5/2017 | Keech |
| 2017/0153760 A1 | 6/2017 | Chawda et al. |
| 2017/0168574 A1 | 6/2017 | Zhang |
| 2017/0168773 A1 | 6/2017 | Keller et al. |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0277350 A1 | 9/2017 | Wang et al. |
| 2017/0277360 A1 | 9/2017 | Breedvelt-Schouten et al. |
| 2017/0031495 A1 | 12/2017 | Tse |
| 2017/0357440 A1 | 12/2017 | Tse |
| 2018/0021811 A1 | 1/2018 | Kutej et al. |
| 2018/0033946 A1 | 2/2018 | Kemppinen et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0139538 A1* | 5/2018 | Macours ................ H03F 3/183 |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |

(56) References Cited

U.S. PATENT DOCUMENTS

| | | |
|---|---|---|
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0194369 A1 | 7/2018 | Lisseman et al. |
| 2018/0196567 A1 | 7/2018 | Klein et al. |
| 2018/0224963 A1 | 8/2018 | Lee et al. |
| 2018/0227063 A1 | 8/2018 | Heubel et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0304310 A1 | 10/2018 | Long et al. |
| 2018/0321056 A1 | 11/2018 | Yoo et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0033348 A1* | 1/2019 | Zeleznik ............... G01D 5/24 |
| 2019/0035235 A1 | 1/2019 | Da Costa et al. |
| 2019/0227628 A1 | 1/2019 | Rand et al. |
| 2019/0044651 A1 | 2/2019 | Nakada |
| 2019/0049499 A1 | 2/2019 | Eissner |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2019/0384898 A1 | 12/2019 | Chen et al. |
| 2020/0117506 A1 | 4/2020 | Chan |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0231085 A1 | 7/2020 | Kunii et al. |
| 2020/0300920 A1 | 9/2020 | Christophersen et al. |
| 2020/0313529 A1 | 10/2020 | Lindemann et al. |
| 2020/0313654 A1 | 10/2020 | Marchais et al. |
| 2020/0314969 A1 | 10/2020 | Marchais et al. |
| 2020/0342724 A1 | 10/2020 | Marchais et al. |
| 2020/0395908 A1* | 12/2020 | Schindler ............... H03F 3/68 |
| 2020/0401292 A1 | 12/2020 | Lorenz et al. |
| 2020/0403546 A1 | 12/2020 | Janko et al. |
| 2021/0108975 A1 | 4/2021 | Peso Parada et al. |
| 2021/0125469 A1 | 4/2021 | Alderson et al. |
| 2021/0153562 A1 | 5/2021 | Fishwick et al. |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0200316 A1* | 7/2021 | Das ............... B06B 1/0261 |
| 2021/0325967 A1 | 10/2021 | Khenkin et al. |
| 2021/0328535 A1 | 10/2021 | Khenkin et al. |
| 2021/0360347 A1 | 11/2021 | Aschieri |
| 2021/0365118 A1 | 11/2021 | Rajapurkar et al. |
| 2022/0026989 A1 | 1/2022 | Rao et al. |
| 2022/0328752 A1 | 10/2022 | Lesso et al. |
| 2022/0404398 A1 | 12/2022 | Reynaga et al. |
| 2022/0408181 A1 | 12/2022 | Hendrix et al. |

FOREIGN PATENT DOCUMENTS

| | | |
|---|---|---|
| CN | 103403796 A | 11/2013 |
| CN | 104811838 A | 7/2015 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| CN | 107835968 A | 3/2018 |
| CN | 210628147 U | 5/2020 |
| CN | 113268138 A | 8/2021 |
| CN | 114237414 A | 3/2022 |
| EP | 0784844 B1 | 6/2005 |
| EP | 2306269 A1 | 4/2011 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| EP | 3546035 A1 | 10/2019 |
| EP | 3937379 A1 | 1/2022 |
| GB | 201620746 A | 1/2017 |
| GB | 2526881 B | 10/2017 |
| IN | 201747044027 | 8/2018 |
| JP | 102130433 B2 | 5/1990 |
| JP | 08149006 A | 6/1996 |
| JP | H10184782 A | 7/1998 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017034973 A1 | 3/2017 |
| WO | 2017113651 A1 | 7/2017 |
| WO | 2017113652 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2020/050822, mailed Aug. 31, 2020.

International Search Report and Written Opinion of the International Searching Authority, International Application No. PCT/GB2020/051438, mailed Sep. 28, 2020.

Invitation to Pay Additional Fees, Partial International Search Report and Provisional Opinion of the International Searching Authority, International Application No. PCT/US2020/052537, mailed Jan. 14, 2021.

International Search Report and Written Opinion of the International Searching Authority, International Application No. PCT/US2020/056610, mailed Jan. 21, 2021.

International Search Report and Written Opinion of the International Searching Authority, International Application No. PCT/GB2020/052537, mailed Mar. 9, 2021.

Examination Report under Section 18(3), United Kingdom Intellectual Property Office, Application No. GB2018050.1, mailed Dec. 22, 2021.

(56) References Cited

OTHER PUBLICATIONS

Second Office Action, National Intellectual Property Administration, PRC, Application No. 2019800208570, issued Jan. 19, 2022.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
First Office Action, China National Intellectual Property Administration, Patent Application No. 2019800211287, Issued Jul. 5, 2021.
Examination Report under Section 18(3), United Kingdom Intellectual Property Office, Application No. GB2018051.9, mailed Nov. 5, 2021.
Final Notice of Preliminary Rejection, Korean Patent Office, Application No. 10-2019-7036236, mailed Nov. 29, 2021.
International Search Report and Written Opinion of the International Searching Authority, International Application No. PCT/GB2019/052991, mailed Mar. 17, 2020, received by Applicant Mar. 19, 2020.
International Search Report and Written Opinion of the International Searching Authority, International Application No. PCT/US2020/023342, mailed Jun. 9, 2020.
International Search Report and Written Opinion of the International Searching Authority, International Application No. PCT/GB2020/050823, mailed Jun. 30, 2020.
Communication Relating to the Results of the Partial International Search, and Provisional Opinion Accompanying the Partial Search Result, of the International Searching Authority, International Application No. PCT/GB2020/050822, mailed Jul. 9, 2020.
International Search Report and Written Opinion of the International Searching Authority, International Application No. PCT/GB2020/051037, mailed Jul. 9, 2020.
International Search Report and Written Opinion of the International Searching Authority, International Application No. PCT/GB2020/051035, mailed Jul. 10, 2020.
Office Action of the Intellectual Property Office, ROC (Taiwan) Patent Application No. 107115475, issued Apr. 30, 2021.
First Office Action, China National Intellectual Property Administration, Patent Application No. 2019800208570, issued Jun. 3, 2021.
International Search Report and Written Opinion of the International Searching Authority, International Application No. PCT/US2021/021908, mailed Jun. 9, 2021.
Notice of Preliminary Rejection, Korean Intellectual Property Office, Application No. 10-2019-7036236 mailed Jun. 29, 2021.
Combined Search and Examination Report, United Kingdom Intellectual Property Office, Application No. GB2018051.9, mailed Jun. 30, 2021.
Communication pursuant to Rule 164(2)(b) and Article 94(3) EPC, European Patent Office, Application No. 18727512.8, mailed Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Examination Opinion Notice, State Intellectual Property Office of the People's Republic of China, Application No. 201880037435.X, issued Dec. 31, 2020.
International Search Report and Written Opinion of the International Searching Authority, International Application No. PCT/GB2019/050964, mailed Sep. 3, 2019.
International Search Report and Written Opinion of the International Searching Authority, International Application No. PCT/GB2019/050770, mailed Jul. 5, 2019.
Communication Relating to the Results of the Partial International Search, and Provisional Opinion Accompanying the Partial Search Result, of the International Searching Authority, International Application No. PCT/US2018/031329, mailed Jul. 20, 2018.
Combined Search and Examination Report, UKIPO, Application No. GB1720424.9, mailed Jun. 5, 2018.
Examination Report under Section 18(3), United Kingdom Intellectual Property Office, Application No. GB2106247.6, mailed Mar. 31, 2022.
Combined Search and Examination Report under Sections 17 and 18(3), UKIPO, Application No. GB2210174.5, mailed Aug. 1, 2022.
Examination Report under Sections 17 and 18(3), UKIPO, Application No. GB2112207.2, mailed Aug. 18, 2022.
International Search Report and Written Opinion of the International Searching Authority, International Application No. PCT/US2022/030541, mailed Sep. 1, 2022.
Vanderborght, B. et al., Variable impedance actuators: A review; Robotics and Autonomous Systems 61, Aug. 6, 2013, pp. 1601-1614.
International Search Report and Written Opinion of the International Searching Authority, International Application No. PCT/US2022/033190, mailed Sep. 8, 2022.
International Search Report and Written Opinion of the International Searching Authority, International Application No. PCT/US2022/033230, mailed Sep. 15, 2022.
Examination Report under sections 17 and 18(3), UKIPO, Application No. GB2115048.7, mailed Aug. 24, 2022.
Communication pursuant to Article 94(3) EPC, European Patent Application No. 18727512.8, mailed Sep. 26, 2022.
Examination Report under Section 18(3), UKIPO, Application No. GB2112207.2, mailed Nov. 7, 2022.
Examination Report, Intellectual Property India, Application No. 202117019138, mailed Jan. 4, 2023.
Second Office Action, National Intellectual Property Administration, PRC, Application No. 2019107179621, issued May 24, 2023.
Examination Report under Section 18(3), UKIPO, Application No. GB2113228.7, mailed Jun. 28, 2023.
Combined Search and Examination Report under Sections 17 and 18(3), UKIPO, Application No. GB2204956.3, mailed Jul. 24, 2023.
Examination Report under Section 18(3), UKIPO, Application No. GB2113228.7, mailed Feb. 10, 2023.
Examination Report under Section 18(3), UKIPO, Application No. GB2113154.5, mailed Feb. 17, 2023.
First Office Action, China National Intellectual Property Administration, Application No. 2019107179621, mailed Jan. 19, 2023.
Examination Report under Section 18(3), UKIPO, Application No. GB2117488.3, mailed Apr. 27, 2023.
Notice of Preliminary Rejection, Korean Intellectual Property Office, Application No. 10-2023-7029306, mailed Sep. 19, 2023.
Examination Report under Section 17, UKIPO, Application No. GB2311104.0 mailed Sep. 4, 2023.
Examination Report under Section 17, UKIPO, Application No. GB2311103.2 mailed Sep. 11, 2023.
First Office Action, China National Intellectual Property Administration, Application No. 2020800313809, issued Jun. 21, 2024.

* cited by examiner

METHODS AND SYSTEMS FOR ESTIMATING TRANSDUCER PARAMETERS

RELATED APPLICATION

The present disclosure claims priority to U.S. Provisional Patent Application Ser. No. 62/826,388, filed Mar. 29, 2019, and U.S. Provisional Patent Application Ser. No. 62/826,348, filed Mar. 29, 2019, each of which is incorporated by reference herein in its entirety.

FIELD OF DISCLOSURE

The present disclosure relates in general to estimating parameters of an electromagnetic load, for example, a haptic transducer.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

In a system having an electromagnetic load such as an LRA, it may be desirable to determine the parameters that define an impedance of the electromagnetic load. Knowledge of such parameters may allow for optimization of playback of signals (e.g., playback of haptic waveforms) to the electromagnetic load. In addition, determination of electromagnetic load impedance may be valuable as it may allow for adapting of a playback signal to allow the playback signal to track changing parameters of the electromagnetic load.

An electromagnetic load such as an LRA may be characterized by its impedance $Z_{Lra}$ as seen as the sum of a coil impedance $Z_{coil}$ and a mechanical impedance $Z_{mech}$:

$$Z_{Lra} = Z_{coil} + Z_{mech} \quad (2)$$

Coil impedance $Z_{coil}$ may in turn comprise a direct current (DC) resistance Re in series with an inductance Le:

$$Z_{coil} = Re + s*Le \quad (3)$$

Mechanical impedance $Z_{mech}$ may be defined by three parameters including the resistance at resonance $R_{RES}$ representing an electrical resistance representative of mechanical friction of the mass-spring system of the haptic transducer, a capacitance $C_{MES}$ representing an electrical capacitance representative of an equivalent moving mass M of the mass-spring system of the haptic transducer, and inductance $L_{CES}$ representative of a compliance C of the mass-spring system of the haptic transducer. The electrical equivalent of the total mechanical impedance is the parallel connection of $R_{RES}$, $C_{MES}$, $L_{CES}$. The Laplace transform of this parallel connection is described by:

$$Z_{mech}(s) = \frac{1}{\left(\frac{1}{R_{RES}} + \frac{1}{L_{CES}*s} + c_{MES}*s\right)} \quad (4)$$

The resonant frequency $f_0$ of the haptic transducer can be represented as:

$$f_0 = \frac{1}{\left(2*\pi*\sqrt{L_{CES}*C_{MES}*}\right)} \quad (5)$$

The quality factor Q of the LRA can be represented as:

$$Q = \frac{R_{RES}*Re}{R_{RES}+Re} * \sqrt{\frac{c_{MES}}{L_{CES}}} \quad (6)$$

Various physical parameters of an LRA, including resistance at resonance $R_{ES}$, angular resonant frequency $\omega_0$ (e.g., $\omega_0=2\pi f_0$), and quality factor q, may vary with temperature and process variations. It may be desirable to obtain a real-time estimate or system identification that tracks these changing parameters in order to model behavior of an LRA in order to maximize its performance. It may be particularly useful to obtain parameter estimates quickly, in a normal course of operation, without the need to introduce special calibration tones or procedures. Thus, it may further be useful to estimate transducer parameters (e.g., perform system identification) efficiently and quickly without disrupting normal operation of a transducer.

SUMMARY

In accordance with the teachings of the present disclosure, the disadvantages and problems associated with identifying parameters of an electromagnetic load may be reduced or eliminated.

In accordance with embodiments of the present disclosure, a system for estimating parameters of an electromagnetic load may include an input for receiving an input excitation signal to the electromagnetic load, a broadband content estimator that identifies at least one portion of the input excitation signal having broadband content, and a parameter estimator that uses the at least one portion of the input excitation signal to estimate and output one or more parameters of the electromagnetic load.

In accordance with these and other embodiments of the present disclosure, a system for estimating parameters of an electromagnetic load may include an input for receiving an input excitation signal to the electromagnetic load, a wideband content block that adds wideband spectral content to the input excitation signal to create a modified input excitation signal, and a parameter estimator that uses the modified input excitation signal to estimate and output one or more parameters of the electromagnetic load.

In accordance with these and other embodiments of the present disclosure, a method for estimating parameters of an electromagnetic load may include receiving an input excitation signal to the electromagnetic load, identifying at least one portion of the input excitation signal having broadband content, and using the at least one portion of the input excitation signal to estimate and output one or more parameters of the electromagnetic load.

In accordance with these and other embodiments of the present disclosure, a method for estimating parameters of an electromagnetic load may include receiving an input excitation signal to the electromagnetic load, adding wideband spectral content to the input excitation signal to create a modified input excitation signal, and using the modified input excitation signal to estimate and output one or more parameters of the electromagnetic load.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 1:
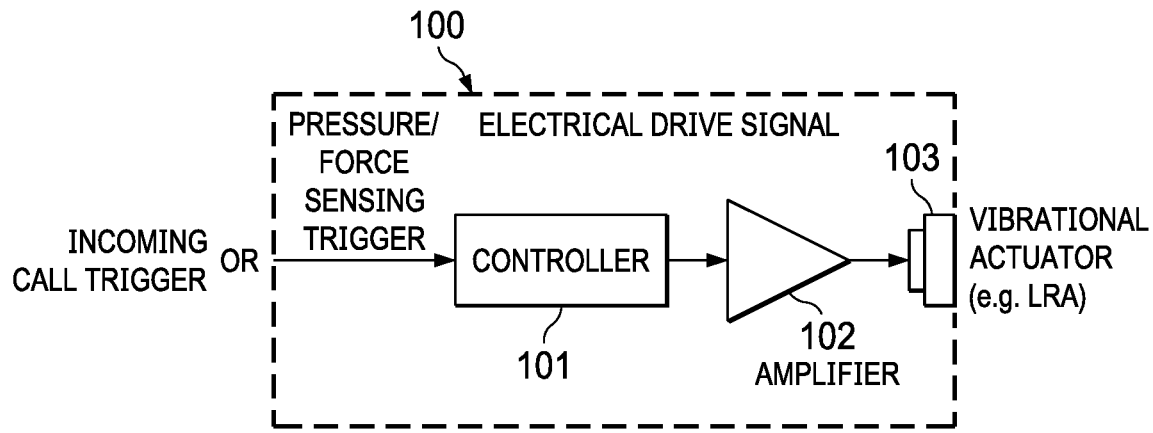
FIG. 1 illustrates an example of a vibro-haptic system in a device, as is known in the art.
Figure 2:
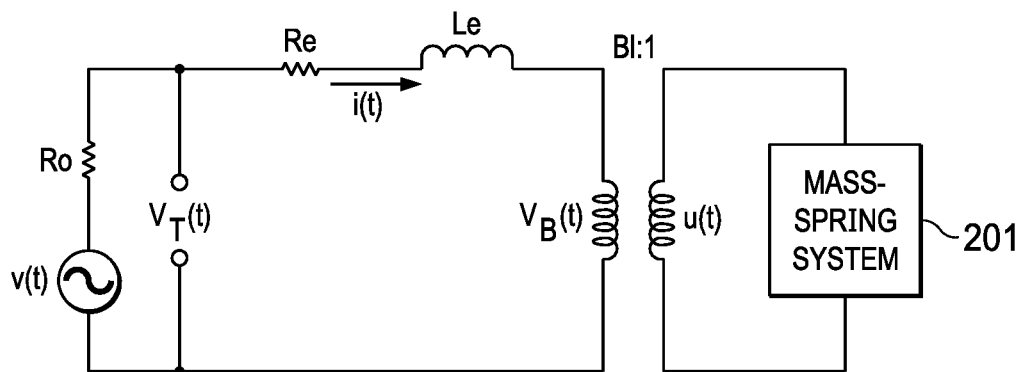
FIG. 2 illustrates an example of a Linear Resonant Actuator (LRA) modelled as a linear system, as is known in the art.

As previously mentioned, identifying parameters of an electromagnetic load may be useful for some types of haptic application. In the present disclosure, and as described in greater detail below, the transducer circuit model described in FIG. 2 above may be modelled within a control system for the transducer. The transducer circuit model described above with respect to FIG. 2 may correspond to a third-order rational function that describes the frequency response of the transducer. The coefficients of the rational function may be converted directly to estimates of the physical parameters—

Re, Le, $R_{ES}$, $C_{MES}$, and $L_{CES}$—or to related parameters $R_{ES}$, $\omega_0$, and q. In accordance with embodiments of the present disclosure, the coefficients of the rational function may also be used directly in a discrete-time infinite impulse response (IIR) filter that simulates the behavior of the transducer. This behavioral simulation may be useful, for example, in implementing a negative impedance digital filter that may be used to improve transducer dynamics as described herein and in U.S. Provisional Patent Application Ser. No. 62/826,348, filed Mar. 29, 2019 and in any application claiming priority thereto, all of which are incorporated by reference in their entireties.

Figure 3A:
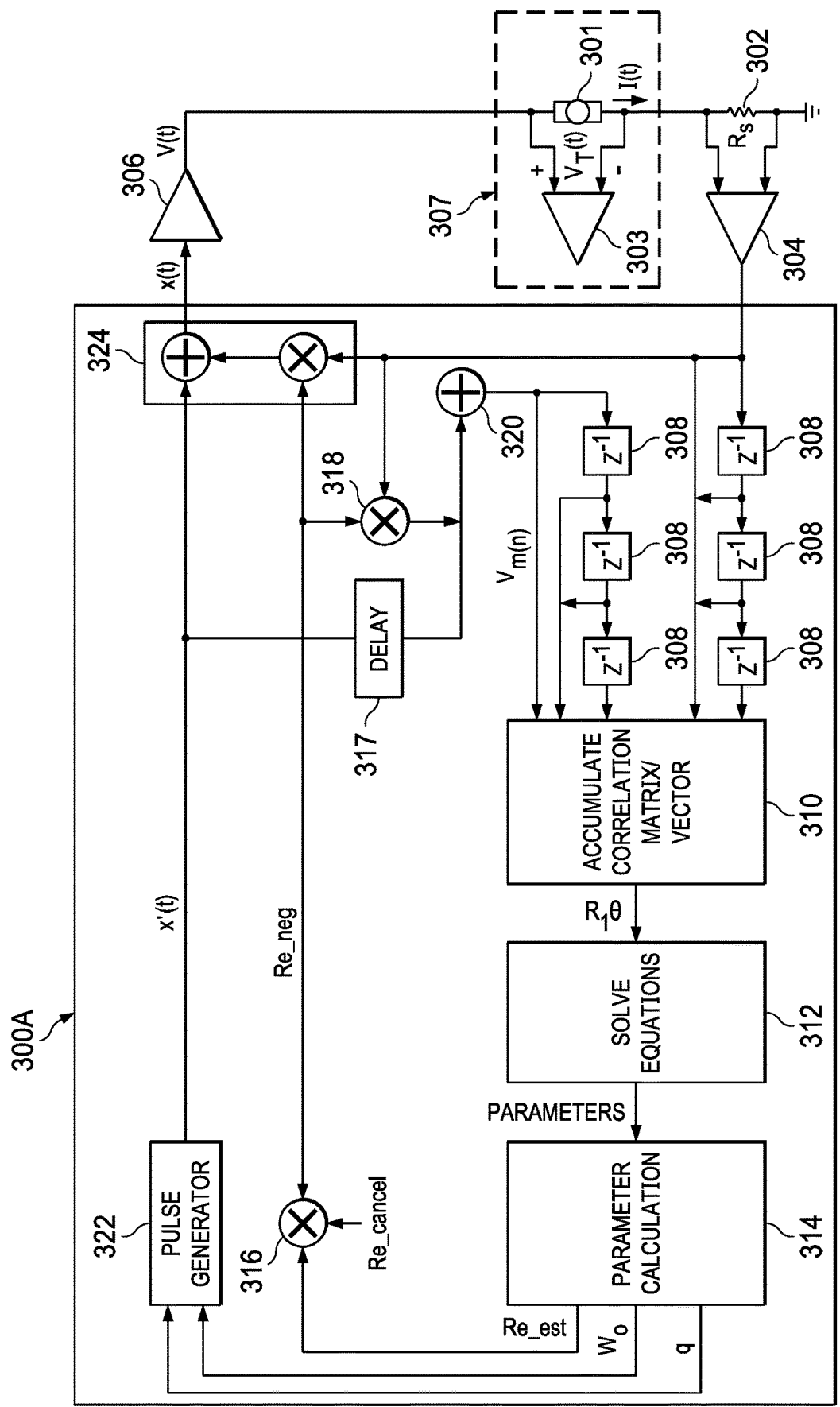
FIGS. 3A-3D each illustrate an example system for identifying mechanical impedance of an electromagnetic load, in accordance with embodiments of the present disclosure.

FIG. 3A illustrates an example system 300A for identifying parameters of an electromagnetic load, in accordance with embodiments of the present disclosure. In some embodiments, system 300A may be integral to a host device comprising system 300A and haptic transducer 301. Such device may include, without limitation, a mobile device, home application, a vehicle, and/or any other system, device, or apparatus that includes a human-machine interface.

In operation, a signal generator 324 of system 300A may generate a waveform signal x(t). Waveform signal x(t) may in turn be amplified by amplifier 306 to generate the driving signal V(t) for driving haptic transducer 301. Although FIG. 3A depicts haptic transducer 301, in some embodiments, another electromagnetic load (e.g., a loudspeaker, a microspeaker, a piezoelectric transducer) may be present in lieu of haptic transducer 301.

Responsive to driving signal V(t), a sensed terminal voltage $V_T(t)$ of haptic transducer 301 may be converted to a digital representation by a first analog-to-digital converter (ADC) 303. Similarly, sensed current I(t) may be converted to a digital representation by a second ADC 304. Current I(t) may be sensed across a shunt resistor 302 having resistance $R_s$ coupled to a terminal of haptic transducer 301. The terminal voltage $V_T(t)$ may be sensed by a terminal voltage sensing block 307, for example a voltmeter.

These real-time digital estimates of sensed terminal voltage $V_T(t)$ and sensed current I(t) may be made available to system 300A, which may be implemented in whole or in part by a central processing unit, digital signal processor, or other digital circuit. As shown in FIG. 3A and described in greater detail below, system 300A may employ least squares and related system identification techniques (e.g., least means square, recursive least squares, etc.) and use time-varying sensed voltage and current signals to compute an estimate of the rational function coefficients (e.g., transducer parameters) corresponding to a frequency response of haptic transducer 301. In system 300A as shown in FIG. 3A, some processing operations such as decimation, interpolation, and filtering of signals may not be shown in order for ease of exposition.

As shown in FIG. 3A, system 300A may use least squares linear regression to estimate transducer parameters. To perform linear regression, in principle, an accumulate correlation matrix/vector block 310 may form a regression matrix X from observed data, for example:

$$X=[I(n-1)I(n-2)I(n-3)V_m(n)V_m(n-1)V_m(n-2)V_m(n-3)]$$

wherein each term of the matrix may comprise an N-length column vector comprising samples having zero, one, two, or three delays. I(i) may represent a digital sample of sensed current I(t) and $V_m(i)$ may represent a digital sample of an estimate of sensed terminal voltage $V_T(t)$ that may be determined by combining (e.g., at combiner 320) a delayed (by delay block 317) version of a raw waveform signal x'(t) generated by pulse generator 322 with a product (e.g., calculated by multiplier 318) of a calculated negative resistance $R_{e\_neg}$ and sensed current I(t). Delayed values within regression matrix X may be determined by delaying digital samples with appropriate delay blocks 308. Thus, regression matrix X may comprise an N×7 matrix where N is the number of samples (e.g., N=813=17 milliseconds of samples at 48 kHz).

Accumulate correlation matrix/vector block 310 may also form an N×1 vector y from output data of the linear regression, in this case the undelayed digitally-sampled sensed current I(n), for example:

$$y=[I(n)]$$

If a parameter vector is defined as:

$$\text{params}=[a1\ a2\ a3\ b0\ b1\ b2\ b3]^T$$

then the third order difference equation above may be rewritten in matrix/vector form as:

$$y=X*\text{params}$$

which suggests that parameters params may be found by solving:

$$\text{params}=X^{-1}*y$$

Because X may be an N×7 rectangular matrix and y has dimensions N×1, and because N is likely to be much greater than 7, the relationships described above may correspond to a highly overdetermined system of equations. Thus, such system of equations may be solved in a least-squares sense—that is, for parameters params—that minimizes the sum of $(y-X*\text{params\_estimate})^2$. To accomplish this determination, both sides of the original regression equation may be multiplied by $X^T$:

$$X^T*y=X^T*X*\text{params}$$

If θ is defined as $\theta=X^T*y$ and R is defined as $R=X^T*X$, then $\theta=R*\text{params}$ and $\text{params}=R^{-1}*y$.

R may thus be a square 7*7 matrix whose entries are the sample auto-correlation and cross-correlations of the columns of the regression matrix X, and θ may be a 7×1 vector of sample cross-correlations of the output undelayed I(n) column vector with the 7 columns of X. This set of equations may be "normal equations" often encountered in statistical signal processing. When correlation or cross-correlation matrices is referenced in this disclosure, it is to be understood that covariance or cross-covariation matrices is referring to substantially the same type of matrices.

The normal equations in this case may represent a system of seven equations in seven unknowns and may be solved for parameters params using a variety of linear algebra techniques including, but not limited to, Gaussian Elimination, Gauss-Jordan, Matrix Inversion, Cholesky Decomposition, and others. In the present disclosure, the simplest of these techniques, Gaussian Elimination, may be emphasized.

The form of the normal equations enables a useful structure for the system identification and model estimation: for every sample (e.g., at 48 kHz or even a lower decimated sample rate), accumulate correlation matrix/vector block 310 may update R and θ correlations from I(i) and $V_m(i)$ (e.g., only R and θ may be maintained in memory and are updated in every sample). Such updates may simply be multiply-accumulate operations. The matrix X or vector y may never be stored or computed in memory—just the correlations R and θ.

When parameters params are desired to be updated, solve equations block 312 may solve $R^{-1}*y$, for example by using Gaussian Elimination. A Gaussian Elimination operation may occur over a typical digital signal processor signal processing frame—(e.g., 48 samples at 48 kHz)—or even be spread over a number of frames.

It may be likely that solve equations block 312 may solve the simultaneous equations once or twice per haptic pulse. For example, for a long haptic pulse generated by a raw waveform signal x'(t) having, for example, ten sinusoidal cycles, digitized samples of the sensed terminal voltage $V_T(t)$ and sensed current I(t) of just the first three cycles may be selected, and a least-squares system identification may need to be determined based only on these three cycle regions. Then, in the case where the estimated model parameters are used to control a negative impedance system, such as described in the previously referenced U.S. Provisional Patent Application Ser. No. 62/826,348, the parameters of a negative impedance IIR filter may be updated shortly after the first three cycles, for example by the fourth cycle, so that when raw waveform signal x'(t) ends after ten cycles, the new estimated model parameters may be in place and may be able to ensure good braking of the haptic pulse, and thus prevent the pulse from ringing far beyond the tenth cycle.

Similarly, another three cycle region of digitized samples of the sensed terminal voltage $V_T(t)$ and sensed current I(t) after raw waveform signal x'(t) ends may be selected and system 300A may perform an additional least-squares estimate based on these cycles to further update the model parameters to assure good braking of the haptic pulse. Alternatively, for a short haptic pulse (e.g., raw waveform signal x'(t) for just two cycles), a region of three cycles of digitized samples of the sensed terminal voltage $V_T(t)$ and sensed current I(t) corresponding to the start of the pulse and including one cycle after the end of the pulse may be selected to perform the system identification.

As just described, raw waveform signal x'(t) often comprises of a small number of cycles of a sinusoid or other narrow-band stimulus. Narrow-band stimuli are often discouraged in system identification applications, because they only excite a limited frequency range of the system. However, by selecting transient regions near the start and stop of a pulse, the wideband transient effects that occur when the sinusoid or narrow band input abruptly turns on or off may be included. Thus, the wideband spectrum associated with the start and/or stop of the selected transient region may provide the necessary wideband stimulus to permit accurate system identification.

System identification of various systems is often performed using least mean squares (LMS), recursive least squares (RLS), or other recursive techniques. These techniques are, in fact, often derived from the description of least-squares and normal equations provided above. However, these techniques often have an explicit or implicit "forgetting factor" that emphasizes the most recent samples of the selected regions at the expense of samples earlier in the region. This emphasizing of most recent samples may be counterproductive in the case where the abrupt start or stop of the input is being relied upon to provide the wideband transient stimulus required for accurate system identification. For this reason, direct computation of the correlation matrix R and cross-correlation matrix θ and corresponding solution of the simultaneous normal equations may be emphasized. The first few samples of a selected transient region may be weighted at least as highly as the last samples of a selected transient region. This approach may enable performance of rapid and accurate least-squares system identification during normal system operation, rather than having to resort to special calibration modes that require broadband noise stimuli or pilot tones.

The sample-by-sample accumulation of matrices R and θ associated with least-squares estimation, previously described above, may enable system 300A to avoid storing sampled segments of sensed terminal voltage $V_T(t)$ and sensed current I(t). Only the correlation matrices may be stored and updated every sample. When a new set of model parameters is desired, the normal equations may be solved or may result in simplified subsets to be described below. The solution of these equations may be spread out across a number of samples—for example one or more sample frames (e.g., where each frame is 48 samples)—to provide efficient distribution of real-time computation. As mentioned, it may be desirable for system 300A to solve the equations once or twice per haptic pulse.

Examples herein may use sensed terminal voltage $V_T(t)$ and sensed current I(t) corresponding to the first 17 milliseconds (e.g., three input cycles at ~176 Hz) of a haptic pulse. Of these 17 milliseconds, the first few milliseconds may be very important as they include wideband information associated with the onset transient of the haptic stimulus. As mentioned above, such haptic pulse characteristics are one of the reasons the use of LMS or RLS with a "forgetting factor" is not desired. Such techniques would deemphasize the first few milliseconds of the 17 milliseconds of samples of sensed terminal voltage $V_T(t)$ and sensed current I(t) in favor of the last few milliseconds. If anything, such techniques result in the opposite of what is desired.

However, it may also not be desired for the sample-by-sample accumulation of correlations of matrices R and θ to go on uninterrupted forever. Instead, accumulate correlation matrix/vector block 310 may explicitly reset matrices R and θ to zero at appropriate times (e.g., at the beginning of a haptic pulse). Accumulate correlation matrix/vector block 310 may accumulate correlations of R and θ until the simultaneous equations are solved (e.g., after 17 milliseconds). If it is desired to perform a further solution of the simultaneous equations later in the pulse that also includes the start transient data, then accumulate correlation matrix/vector block 310 may continue the accumulation of correlations until the next time the equations are solved. For example, in some embodiments, system 300A may solve the simultaneous equations a second time 1-2 milliseconds after raw waveform signal x'(t) ends. At that point, matrices R and θ may reflect both the wideband transient behavior of the start of raw waveform signal x'(t) and the wideband transient behavior due to an abrupt stop of raw waveform signal x'(t). This combined start and stop wideband transient behavior may provide a particularly rich set of correlations and may lead to a robust estimate of model parameters. System 300A may also save parameter estimates from one haptic pulse to the next pulse so that they may be used, for example as initial negative impedance IIR filter conditions, in future estimates.

The parameters determined by the least-squares system identification are coefficients of a rational function, or equivalently of a difference equation, that describes the electrical equivalent impedance of the physical LRA. For example the expression:

$$Z_{LRA} = (b0 + b1*z^{-1} + b2*z^{-2} + b3*z^{-3})/(1 - a1*z^{-1} - a2*z^{-2} - a3*z^{-1})$$

involves the seven parameters b0, b1, b2, b3, a1, a2, a3 which may be seven parameters params determined from least-squares estimation as described above. These seven parameters may also serve as the parameters of a digital IIR filter that provides a digital model of the LRA behavior and may be used to control a negative impedance system, such as described in the previously referenced U.S. Provisional Patent Application Ser. No. 62/826,348.

A parameter calculation block 314 may translate these coefficients to physical parameters—for example, DC resistance Re, angular resonant frequency $\omega_0$ (or resonant frequency $f_0$), and quality factor q—using algebraic calculations as described below. For example, parameter calculation block 314 may calculate an estimate $R_{e\_est}$ for DC resistance Re as the direct current value (e.g., z=1) of the impedance given in the above expression for $Z_{LRA}$ by sensed terminal voltage $V_T(t)$ divided by sensed current I(t). Substituting for z=1 in the above expression for $Z_{LRA}$ provides an expression for the DC resistance:

$$R_{e\_est}=(b0+b1+b2+b3)/(1-a1-a2-a3)$$

To obtain estimates for quality factor q and resonant frequency $f_0$ of transducer 301, parameter calculation block 314 may convert the complex conjugate discrete time z-domain poles and zeros of the estimated impedance transfer function given above to continuous time s-domain poles and zeros:

$$p_{cont}=\log(p)*f_s;$$

$$z_{cont}=\log(z)*f_s$$

where p and z are the discrete time complex poles and zeros of the impedance transfer function described by the rational function model parameters determined by least-squares system identification, $p_{cont}$ and $z_{cont}$ are s-domain continuous time poles and zeros, and $f_s$ is the sampling frequency in the discrete-time domain.

An estimated damping factor $\zeta_{est}$ and an estimated quality factor $q_{est}$ for entire transducer 301 (both mechanical and electrical components together) may be given by:

$$\zeta_{est}=\text{real}(z_{cont}); \text{ and}$$

$$q_{est}=1/(2*\zeta_{est}).$$

The estimated mechanical damping factor $\zeta_{mech\_est}$ and estimate mechanical quality factor $q_{mech\_est}$ may be given by:

$$\zeta_{mech\_est}=\text{real}(p_{cont}) \text{ and}$$

$$q_{mech\_est}=1/(2*\zeta_{mech\_est}).$$

Estimated resonant frequency $f_{0\_est}$ of transducer 301 may be given by $$f_{0\_est}=|p_{cont}|/2\pi|$$

It may be the case that an explicit expression for estimated coil inductance Le is not of interest, although the information for determining coil inductance Le may be within estimated rational function least-squares parameters params. For example, it may be the case that a negative impedance system uses only estimated DC resistance $R_{e\_est}$ in a negative impedance feedback path rather than estimated DC resistance $R_{e\_est}$ and estimated coil inductance Le in series, or that a feedback path consists of estimated DC resistance $R_{e\_est}$ in series with a fixed, predetermined value coil inductance Le.

Thus, from parameters params, parameter calculation block 314 may calculate physical parameters of transducer 301, including DC resistance Re, angular resonant frequency $\omega_0$, and quality factor q. From angular resonant frequency $\omega_0$ and quality factor q, pulse generator 322 may generate raw waveform signal x'(t), for example, having a frequency at or near angular resonant frequency $\omega_0$ in order to provide the strongest haptic effect at transducer 301. Further, system 300A may apply (e.g., at multiplier 316) a multiplicative factor $R_{e\_cancel}$ to an estimated DC resistance Re $R_{e\_est}$ to generate a negative resistance $R_{e\_neg}$ that may be applied by signal generator 324 to raw waveform signal x'(t) in order to generate waveform signal x(t).

Although system 300A may estimate from a short sinusoidal pulse, improved performance may also be possible with the addition of multiple sinusoids. For example, subharmonic or superharmonic sinusoids may be added at frequencies lower than or higher than the principle sinusoid. The addition of such other sinusoids may increase the bandwidth for the steady-state stimulus.

Figure 3B:
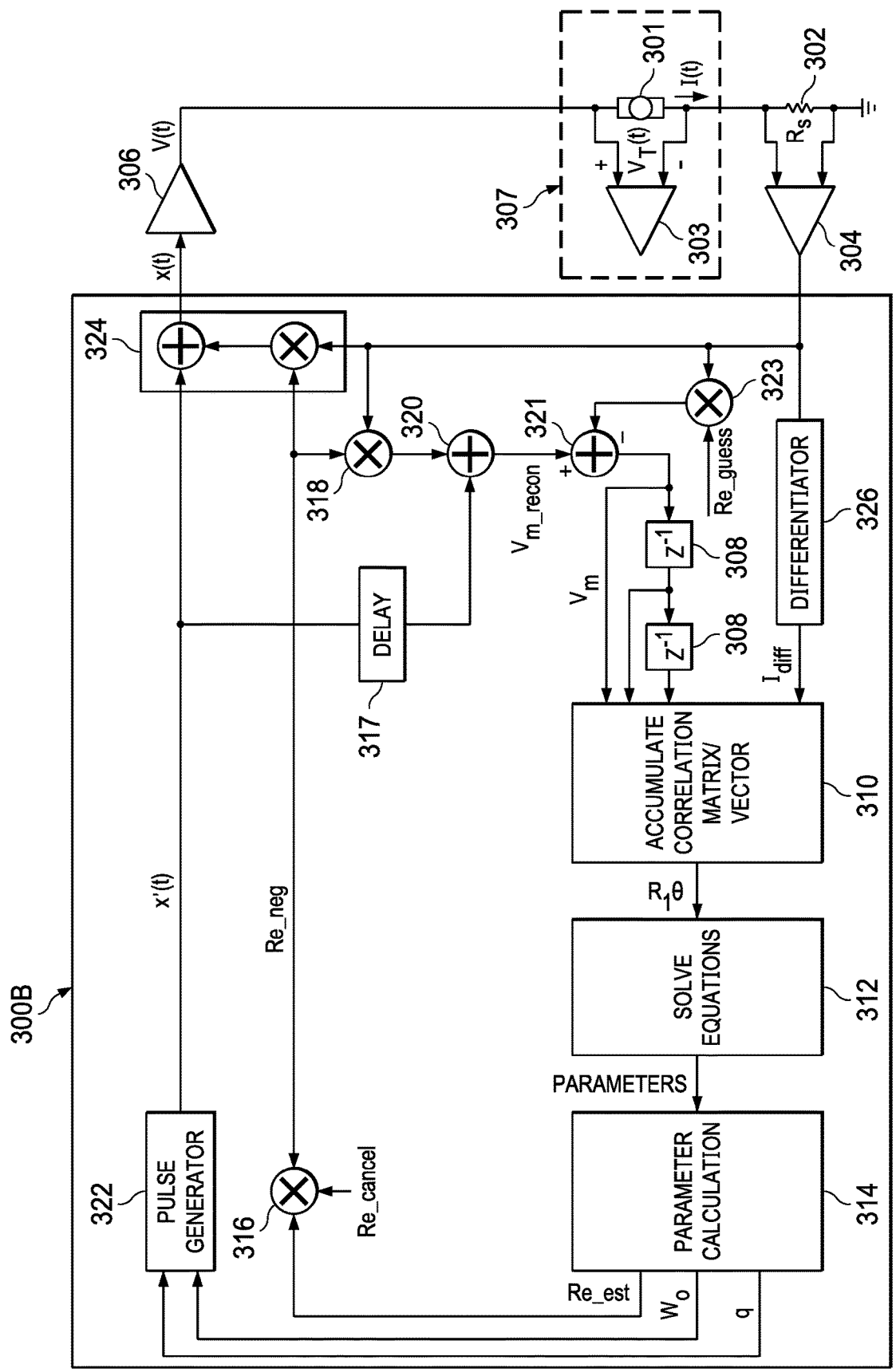

FIG. 3B illustrates an example system 300B for identifying parameters of an electromagnetic load, in accordance with embodiments of the present disclosure. In some embodiments, system 300B may be integral to a host device comprising system 300B and haptic transducer 301. Such device may include, without limitation, a mobile device, home application, a vehicle, and/or any other system, device, or apparatus that includes a human-machine interface. System 300B may be similar in many respects to system 300A, and thus, only certain differences between system 300B and system 300A may be discussed below.

The solution described above with respect to system 300A may involve inverting, or equivalently finding a more numerically robust "pseudo-inverse" of a 7×7 matrix. This solution may be numerically challenging, especially in fixed-point implementations. The size of the 7×7 matrix may be reduced by observing that there are certain fixed relationships between the numerator and denominator coefficients of the rational function. For example, estimated DC resistance $R_{e\_est}$ may be determined separately by averaging:

$$R_{e\_est} = \sqrt{\overline{\left(\frac{V_{T\_LP}(t)^2}{I_{LP}(t)^2}\right)}}$$

wherein the bar under the radical represents an average of the fraction under the radical, $V_{T_{LP}}(t)$ is a low-pass filtered version of $V_T(t)$ and $I_{LP}(t)$ is a low-pass filtered version of I(t), wherein the low-pass cutoff frequency of a filter for generating such low-pass filtered versions is lower than resonant frequency $f_0$ of transducer 301.

If coil inductance Le is known a-priori, within acceptable tolerance (e.g., by laboratory measurements), or is otherwise estimated, then a discrete time model of the coil impedance $Z_{coil}$ may be given as:

$$Z_{coil} = \frac{(Re + 2Lef_s)z + Re - 2Lef_s}{z+1}$$

Coil impedance $Z_{coil}$ may be eliminated from the estimation problem by forming the signal:

$$V_m(z)=V_T(z)-Z_{coil}I(z)$$

wherein $Z_{coil}I(z)$ may simply be sensed current I(z) filtered by a difference equation corresponding to the rational expression for coil impedance $Z_{coil}$.

Instead of estimating the full LRA impedance $$Z_{Lra}(z) = \frac{V_T(z)}{I(z)},$$

mechanical impedance $Z_{mech}$ may be estimated as:

$$Z_{mech}(z) = \frac{V_m(z)}{I(z)}$$

This equation for mechanical impedance $Z_{mech}$ may be rewritten in the form:

$$Z_{mech}(z) = \frac{t_{b0} - t_{b2}z^{-2}}{t_{a0} + t_{a1}z^{-1} + t_{a2}z^{-2}} = \frac{t_g(1 - z^{-2})}{t_{a0} + t_{a1}z^{-1} + t_{a2}z^{-2}}$$

wherein:

$t_g = t_{b0} = t_{b2} = 2L_{CES}R_{RES}f_s$ $t_{a0} = 4C_{MES}L_{CES}R_{RES}f_s^2 + 2L_{CES}f_s + R_{RES}$ $t_{a1} = -8C_{MES}L_{CES}R_{RES}f_s^2 + 2R_{RES}$ $t_{a2} = 4C_{MES}L_{CES}R_{RES}f_s^2 - 2L_{CES}f_s + R_{RES}$

A differentiator 326 may further differentiate sensed current I(t), resulting in:

$I_{diff}(z) = I(z)(1 - z^{-2})$ wherein $(1-z^{-2})$ may correspond to a transfer function of differentiator 326 with impulse response [1 0 −1]. Instead of estimating full LRA impedance $Z_{Lra}$ as above, the following expression for a differential mechanical impedance $Z_{mech\_diff\_est}$ may be estimated as follows:

$$Z_{mech\_diff\_est}(z) = \frac{V_{m\_mech}(z)}{I_{diff}(z)}$$

which may be written as:

$$Z_{mech\_diff\_est}(z) = \frac{t_g}{t_{a0} + t_{a1}z^{-1} + t_{a2}z^{-2}}$$

or equivalently by dividing both the numerator and denominator by $t_g$ as:

$$Z_{mech\_diff\_est}(z) = \frac{1}{t_{a0}/t_g + t_{a1}z^{-1}/t_g + t_{a2}z^{-2}/t_g}$$

Using the following definitions:

$p_{a0} = t_{a0}/t_g$;

$p_{a1} = t_{a1}/t_g$; and $p_{a2} = t_{a2}/t_g$ then the expression for differential mechanical impedance $Z_{mech\_diff\_est}$ may be rewritten as follows:

$$Z_{mech\_diff\_est}(z) = \frac{t_g}{p_{a0} + p_{a1}z^{-1} + p_{a2}z^{-2}}$$

which may correspond to the difference equation:

$I_{diff}(n) = v_m(n) + v_m(n-1) + v_m(n-2)$

Accumulate correlation matrix/vector block 310 may estimate (e.g., using least-squares regression) the parameters $p_{a0}$, $p_{a1}$, and $p_{a2}$ with signals $V_m$ and $I_{diff}$ as input and output data. Such estimation may involve the inversion of a 3×3 matrix, which may be simpler than the 7×7 matrix described above with respect to system 300A.

By dividing the numerator and denominator of the previous expression for differential mechanical impedance $Z_{mech\_diff\_est}$ by parameter $p_{a0}$, it may be put into a more standard digital signal processing form of:

$$Z_{mech\_diff\_est}(z) = \frac{g}{1 + a_1 z^{-1} + a_2 z^{-2}}$$

where:

$g = \dfrac{1}{p_{a0}}$;

$a_1 = \dfrac{p_{a1}}{p_{a0}}$; and $a_2 = \dfrac{p_{a2}}{p_{a0}}$

System 300B depicts a system for performing the least-squares regression described above, with a somewhat simpler variant, in that sensed voltage signal $V_T(t)$ corresponds in FIG. 3B to reconstructed voltage signal $V_{m\_recon}$ and voltage signal $V_m = V_T(t) - \text{ReI}(t)$ (e.g., rather than $V_m = V_T(t) - Z_{coil}I(t)$). However, the inclusion of coil inductance Le in coil impedance $Z_{coil}$ may result in a more accurate estimate of differential mechanical impedance $Z_{mech\_diff\_est}(z)$ by accumulate correlation matrix/vector block 310.

Based on the estimated differential mechanical impedance $Z_{mech\_diff\_est}(z)$ and resulting parameters g, $a_1$, and $a_2$, system 300B may compute and estimate full LRA impedance $Z_{Lra}$ using a predetermined estimated DC resistance Re and coil inductance Le:

$Z_{Lra\_est}(z) = Z_{mech\_diff\_est}(z)(1 + z^{-2}) + Z_{coil}$

The result may be a three-pole, three-zero rational function with the same form as that obtained by the 7×7 correlation matrix estimation of system 300A.

The inverse of estimated full LRA impedance $Z_{Lra\_est}(z)$ may be given by:

$$G_{Lra\_est}(z) = \frac{I(z)}{V_T(z)} \cong \text{inverse}(Z_{Lra\_est}(z))$$

which corresponds to a third-order difference equation. Sensed voltage $V_T(t)$ may be filtered by this third-order difference equation to generate a predicted sensed current $I_{pred}$:

$I_{pred}(z) = V_T(z)G_{Lra\_est}(z)$

Because a direct measure of sensed current I(t) is available in system 300B, a squared error may be computed as:

$\text{error}_{est} = (I_{pred}(t) - I(t))^2$

Another approach to estimating DC resistance Re may be to begin with a guess, shown in FIG. 3B as Re_guess, and then iterate the estimation full LRA impedance $Z_{Lra\_est}$, computing error $\text{error}_{est}$ based on resistance guess Re_guess. After each iteration, system 300B may adjust resistance guess Re_guess following a gradient descent on error $\text{error}_{est}$ as a function of resistance guess Re_guess, until the change in resistance guess Re_guess falls below a predefined tolerance.

Figure 3C:
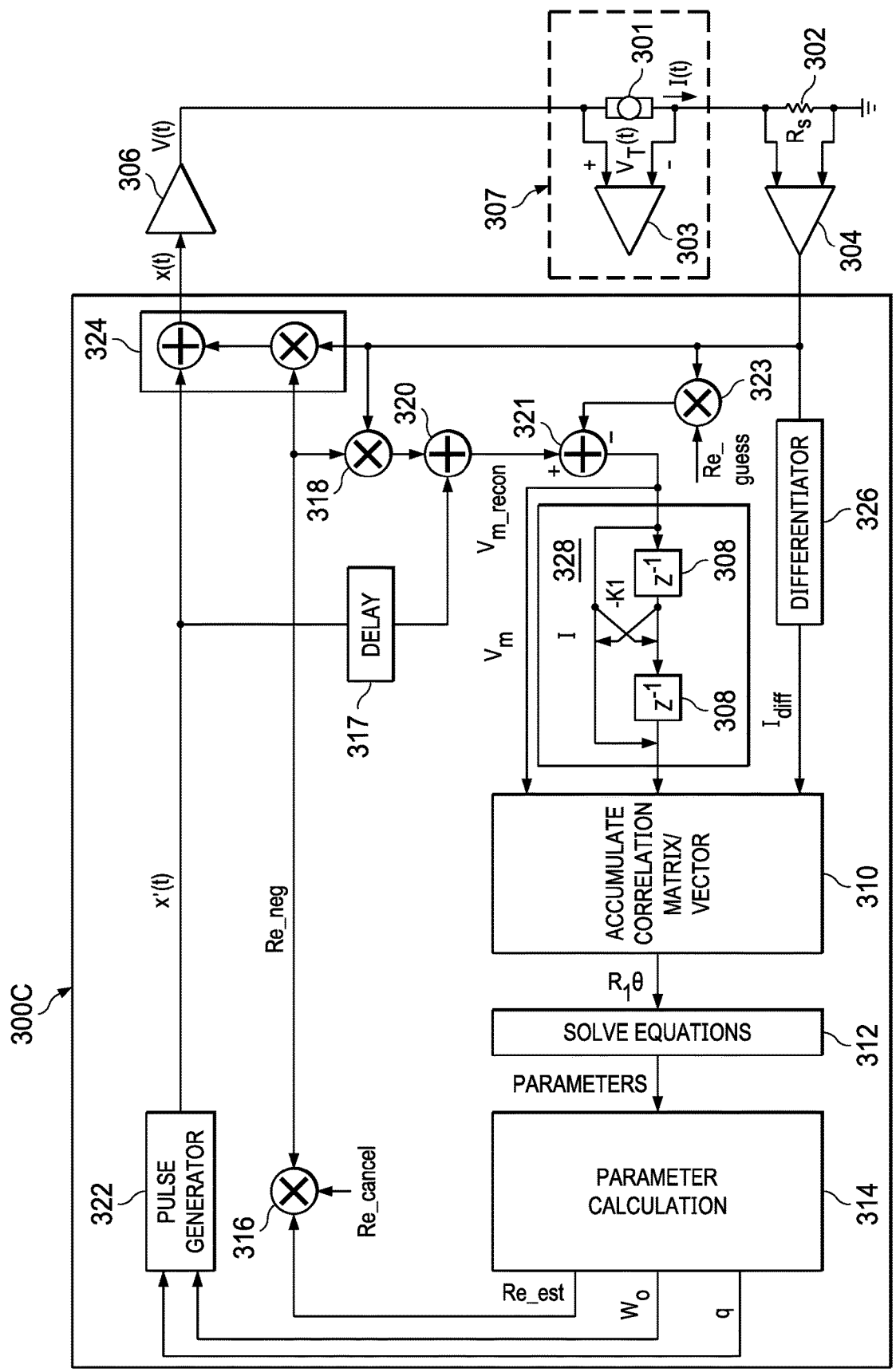

FIG. 3C illustrates an example system 300C for identifying parameters of an electromagnetic load, in accordance with embodiments of the present disclosure. In some embodiments, system 300C may be integral to a host device comprising system 300C and haptic transducer 301. Such device may include, without limitation, a mobile device, home application, a vehicle, and/or any other system, device, or apparatus that includes a human-machine interface. System 300C may be similar in many respects to system 300B, and thus, only certain differences between system 300C and system 300B may be discussed below.

It may be desirable for regressor signals that are used to form correlation matrices to be uncorrelated between themselves. Such decorrelation may diagonalize much of the correlation matrix, which may lead to numerically superior results. System 300C may include a lattice filter 328 to accomplish such decorrelation of signals, as shown in FIG. 3C. One interesting property of the specific lattice filter coefficients chosen in FIG. 3C is that the second tap output of lattice filter 328 may be a notch filter at the resonant frequency $f_0$ of transducer 301. Such property may mean that a ratio of the smoothed magnitude of the second tap signal of lattice filter 328 may be used to estimate DC resistance Re with less low-pass filtering than that described above in the ratio of low-pass filtered sensed voltage signal $V_T(t)$ and sensed current signal $I(t)$ because the large changes in impedance at resonant frequency $f_0$ may be largely eliminated by the notch output of the second tap of lattice filter 328. Accordingly, system 300C may use a simpler low-pass filter (e.g., than that of system 300B) to eliminate effects of coil inductance Le which may be significant at higher frequencies well above resonance.

Figure 3D:
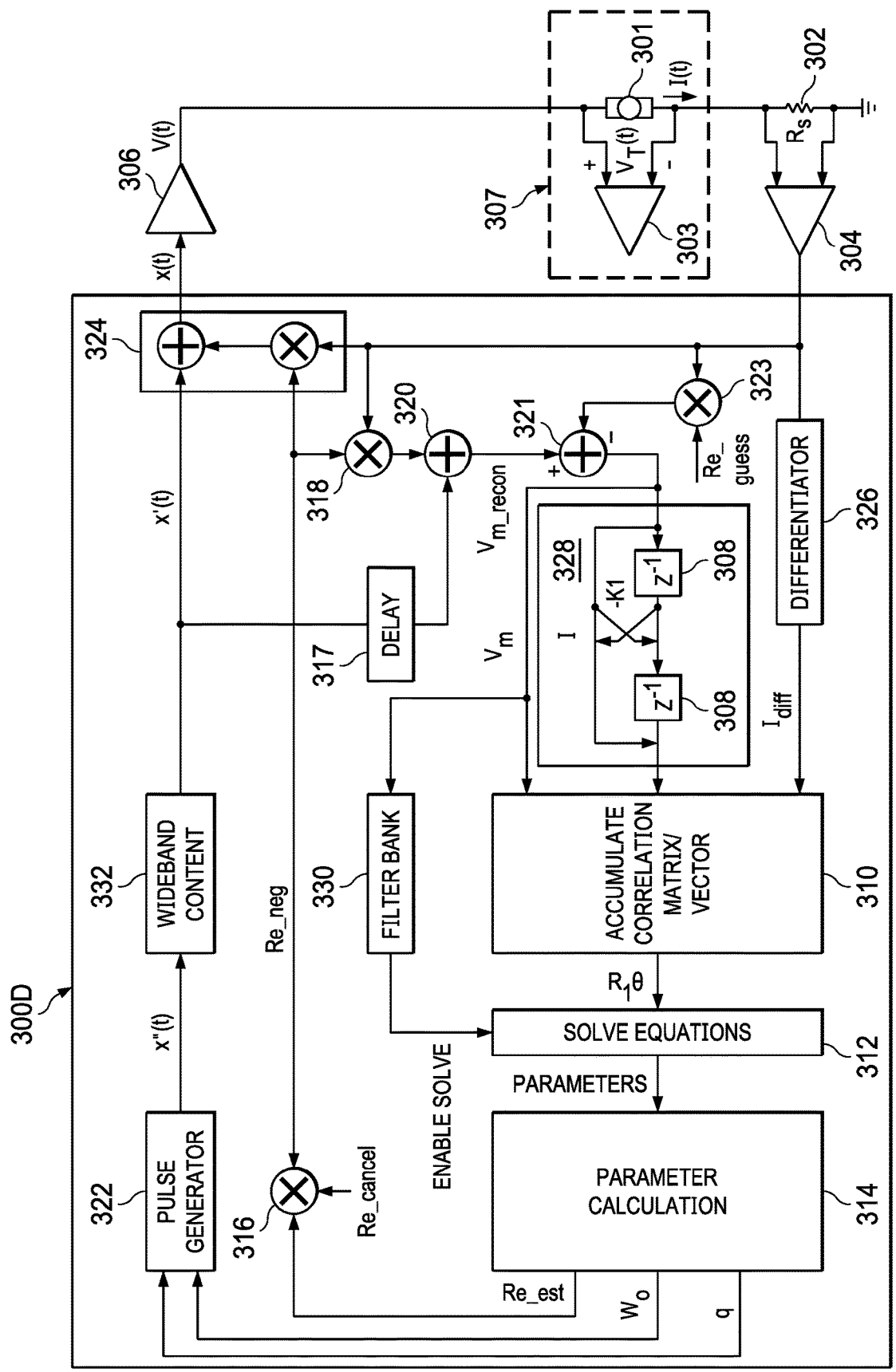

FIG. 3D illustrates an example system 300D for identifying parameters of an electromagnetic load, in accordance with embodiments of the present disclosure. In some embodiments, system 300D may be integral to a host device comprising system 300D and haptic transducer 301. Such device may include, without limitation, a mobile device, home application, a vehicle, and/or any other system, device, or apparatus that includes a human-machine interface. System 300D may be similar in many respects to system 300D, and thus, only certain differences between system 300D and system 300C may be discussed below.

In some instances, it may be desired to form an explicit estimate of the broadband content of voltage signal $V_m$. If voltage signal $V_m$ is determined to be sufficiently broadband, then solution of the normal equations may be enabled. Otherwise, the solution to the normal equation may be disabled.

As shown in FIG. 3D, system 300D may include filter bank 330. Filter bank 330 may receive voltage signal $V_m$ as input and pass it through a bank of filter channels of different frequencies. If the output of filter bank 330 shows sufficient energy in a wide range of frequency bands, then voltage signal $V_m$ may be a wideband signal. Filter bank 330 may generate an ENABLE SOLVE signal which may be input to solve equations block 312 to enable solution of the normal equations after voltage signal $V_m$ has been explicitly determined to be sufficiently broadband. It will be recognized by those skilled in the art of spectral estimation, that there are many ways to measure the spectrum and bandwidth of a signal. Any of these methods, including parametric spectral estimation techniques and spectral tilt estimates may be used in place of filter bank 330 to form an estimate of the bandwidth of voltage signal $V_m$ in order to generate the ENABLE SOLVE signal.

In order to guarantee a broadband $V_m$ signal to facilitate parameter estimation, it may be desired to artificially add broadband content to the output of pulse generator 322. Accordingly, a wideband content block 332 of system 300D may receive a raw waveform signal x"(t) from pulse generator 322 and add wideband content to such signal to generate modified raw waveform signal x'(t) for input to signal generator 324. Wideband content block 332 may use any suitable approach to add wideband content to raw waveform signal x"(t) to generate modified raw waveform signal x'(t). For example, in some embodiments, wideband content block 332 may comprise a wideband noise generator whose output may be added or multiplied with raw waveform signal x"(t) to generate modified raw waveform signal x'(t). In other embodiments, wideband content block may comprise a distortion circuit configured to clip or otherwise distort raw waveform signal x"(t) to increase its wideband content. As a further example, wideband content block 332 may comprise a modulation circuit to modulate raw waveform signal x"(t) to increase its wideband content.

The foregoing discloses example embodiments of systems and methods for least-squares estimation for finding the parameters of a transducer, and several embodiments for constraining and simplifying the least-squares estimation have been illustrated and discussed. This constraining and simplifying may allow for quickly and efficiently estimating the parameters of a transducer in real-time without interfering with the normal operation of the system.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system for estimating parameters of an electromagnetic load comprising:
    an input for receiving an input excitation signal to the electromagnetic load;
    a broadband content estimator that identifies at least one portion of the input excitation signal having broadband content; and
    a parameter estimator that uses the at least one portion of the input excitation signal to estimate and output one or more parameters of the electromagnetic load.

2. The system of claim 1, wherein the at least one portion of the input excitation signal is a beginning of a transient of the input excitation signal.

3. The system of claim 1, wherein the at least one portion of the input excitation signal is an end of a transient of the input excitation signal.

4. The system of claim 1, wherein the broadband content estimator comprises a filter bank to determine spectral broadness of the input excitation signal at any portion of the input excitation signal.

5. The system of claim 1, wherein the electromagnetic load is a haptic transducer and the input excitation signal is a haptic waveform for driving the haptic transducer.

6. The system of claim 1, wherein the at least one portion of the input excitation signal comprises a beginning of the haptic waveform.

7. The system of claim 1, wherein the at least one portion of the input excitation signal comprises an end of the haptic waveform.

8. The system of claim 1, wherein the at least one portion of the input excitation signal comprises a beginning of the haptic waveform and an end of the haptic waveform.

9. A system for estimating parameters of an electromagnetic load comprising:
    an input for receiving an input excitation signal to the electromagnetic load;
    a wideband content block that adds wideband spectral content to the input excitation signal to create a modified input excitation signal; and
    a parameter estimator that uses the modified input excitation signal to estimate and output one or more parameters of the electromagnetic load.

10. The system of claim 9, wherein the electromagnetic load is a haptic transducer and the input excitation signal is a haptic waveform for driving the haptic transducer.

11. A method for estimating parameters of an electromagnetic load comprising:
    receiving an input excitation signal to the electromagnetic load;
    identifying at least one portion of the input excitation signal having broadband content; and
    using the at least one portion of the input excitation signal to estimate and output one or more parameters of the electromagnetic load.

12. The method of claim 11, wherein the at least one portion of the input excitation signal is a beginning of a transient of the input excitation signal.

13. The method of claim 11, wherein the at least one portion of the input excitation signal is an end of a transient of the input excitation signal.

14. The method of claim 11, wherein identifying at least one portion of the input excitation signal having broadband content comprises using a filter bank to determine spectral broadness of the input excitation signal at any portion of the input excitation signal.

15. The method of claim 11, wherein the electromagnetic load is a haptic transducer and the input excitation signal is a haptic waveform for driving the haptic transducer.

16. The method of claim 11, wherein the at least one portion of the input excitation signal comprises a beginning of the haptic waveform.

17. The method of claim 11, wherein the at least one portion of the input excitation signal comprises an end of the haptic waveform.

18. The method of claim 11, wherein the at least one portion of the input excitation signal comprises a beginning of the haptic waveform and an end of the haptic waveform.

19. A method for estimating parameters of an electromagnetic load comprising:
    receiving an input excitation signal to the electromagnetic load;
    adding wideband spectral content to the input excitation signal to create a modified input excitation signal; and
    using the modified input excitation signal to estimate and output one or more parameters of the electromagnetic load.

20. The method of claim 19, wherein the electromagnetic load is a haptic transducer and the input excitation signal is a haptic waveform for driving the haptic transducer.

* * * * *